(12) United States Patent
Jeong et al.

(10) Patent No.: US 10,998,393 B2
(45) Date of Patent: May 4, 2021

(54) ORGANIC LIGHT-EMITTING DIODE DISPLAY DEVICE

(71) Applicant: SAMSUNG DISPLAY CO., LTD., Yongin-si (KR)

(72) Inventors: Woo Ho Jeong, Anyang-si (KR); Se Myung Kwon, Yongin-si (KR); Yoon Ho Kim, Asan-si (KR); Seok Je Seong, Seongnam-si (KR); Joon Hoo Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/822,222

(22) Filed: Mar. 18, 2020

(65) Prior Publication Data

US 2020/0219954 A1 Jul. 9, 2020

Related U.S. Application Data

(63) Continuation of application No. 16/270,072, filed on Feb. 7, 2019, now Pat. No. 10,622,430.

(30) Foreign Application Priority Data

Jun. 12, 2018 (KR) .......................... 10-2018-0067489

(51) Int. Cl.
*H01L 27/32* (2006.01)
*H01L 29/786* (2006.01)
(Continued)

(52) U.S. Cl.
CPC ........ *H01L 27/3262* (2013.01); *H01L 21/477* (2013.01); *H01L 29/66969* (2013.01); *H01L 29/7869* (2013.01); *H01L 29/78675* (2013.01)

(58) Field of Classification Search
CPC ........... H01L 29/78675; H01L 29/7869; H01L 27/3262; H01L 21/477
See application file for complete search history.

(56) References Cited

U.S. PATENT DOCUMENTS 9,698,279 B2 7/2017 Kim
2015/0102343 A1 4/2015 Park et al.
(Continued)

FOREIGN PATENT DOCUMENTS

| KR | 20150050058 | 5/2015 |
|---|---|---|
| KR | 20180003364 | 1/2018 |
| KR | 20180005311 | 1/2018 |

*Primary Examiner* — Christine A Enad
(74) *Attorney, Agent, or Firm* — F. Chau & Associates, LLC

(57) ABSTRACT

An organic fight-emitting display device comprises a first thin-film transistor disposed on a substrate; and a second thin-film transistor disposed on the substrate and spaced apart from the first thin-film transistor. The first thin-film transistor comprises a first semiconductor layer, a first conductive layer disposed on the first semiconductor layer and that overlaps the first semiconductor layer, and a first insulating layer disposed between the first semiconductor layer and the first conductive layer. The second thin-film transistor comprises a second semiconductor layer, and a second conductive layer disposed on the second semiconductor layer and that overlaps the second semiconductor layer. The first semiconductor layer is disposed on a layer higher than the second semiconductor layer, the first semiconductor layer comprises an oxide semiconductor, the second semiconductor layer comprises low temperature polycrystalline silicon (LTPS), and the first insulating layer covers the entire first semiconductor layer.

12 Claims, 9 Drawing Sheets

(51) Int. Cl.
    *H01L 21/477* (2006.01)
    *H01L 29/66* (2006.01)

(56) References Cited

U.S. PATENT DOCUMENTS

| | | | |
|---|---|---|---|
| 2015/0108475 A1* | 4/2015 | Ando | C23C 14/351 257/43 |
| 2016/0071916 A1* | 3/2016 | Kim | H01L 27/3265 257/40 |
| 2016/0343737 A1* | 11/2016 | Zhang | H01L 29/78678 |
| 2017/0278916 A1* | 9/2017 | Maruyama | H01L 27/1255 |
| 2018/0122298 A1 | 5/2018 | Lee et al. | |
| 2018/0233596 A1* | 8/2018 | Ohara | H01L 29/66969 |
| 2019/0378886 A1 | 12/2019 | Jeong et al. | |

\* cited by examiner

ORGANIC LIGHT-EMITTING DIODE DISPLAY DEVICE

This application is a continuation of U.S. application Ser. No. 16/270,072, filed on Feb. 7, 2019 in the U.S. Patent and Trademark Office, which claims priority under 35 U.S.C. § 119 from, and the benefit of, Korean Patent Application No. 10-2018-0067489, filed on Jun. 12, 2018 in the Korean Intellectual Property Office, the contents of both of which are herein incorporated by reference in their entireties.

BACKGROUND

1. Technical Field

Embodiments of the present disclosure are directed to an organic light-emitting diode display device.

2. Discussion of the Related Art

Flat panel displays (FPDs) are employed by various types of electronic devices, including mobile phones, tablet PCs, laptop computers, etc. Flat panel display devices, hereinafter referred to as display devices, include liquid-crystal display (LCD) devices, plasma display panel (PDP) devices, organic, light-emitting display (OLED) devices, etc. Recently, an electrophoretic display (EPD) device has become widely used as well.

An organic light-emitting display device displays images by using an organic light-emitting element that emits light as electrons and holes recombine. An organic light-emitting display device includes a plurality of transistors that provide a driving current to the organic light-emitting element.

Typically, PMOS transistors are used as transistors of an organic light-emitting display device. However, there have been studies of using NMOS transistors solely or in combinations with PMOS transistors.

SUMMARY

Embodiments of the present disclosure can provide an organic light-emitting display device that enables a semiconductor layer of an NMOS transistor to be doped with n-type impurity ions simply by heat treatment, without a pre-process.

According to an embodiment of the present disclosure, there is provided an organic light-emitting display device. The organic light-emitting display device comprises a first thin-film transistor disposed on a substrate; and a second thin-film transistor disposed on the substrate and that is spaced apart from the first thin-film transistor. The first thin-film transistor comprises a first semiconductor layer, a first conductive layer disposed on the first semiconductor layer and that overlaps the first semiconductor layer, and a first insulating layer disposed between the first semiconduc- tor layer and the first conductive layer. The second thin-film transistor comprises a second semiconductor layer, and a second conductive layer disposed on the second semicon- ductor layer and that overlaps the second semiconductor layer. The first semiconductor layer is disposed on a layer higher than the second semiconductor layer, the first semi- conductor layer comprises an oxide semiconductor, the second semiconductor layer comprises low temperature polycrystalline silicon (LTPS), and the first insulating layer covers an entirety of the first semiconductor layer.

According to an embodiment of the present disclosure, there is provided an organic light-emitting display device. The organic light-emitting display device comprises a buffer layer disposed on a substrate; a first semiconductor layer disposed on the buffer layer; a first insulating layer disposed on the first semiconductor layer; a first conductive layer disposed on the first insulating layer and that overlaps the first semiconductor layer; a second insulating layer disposed on the first conductive layer; a second conductive layer disposed on the second insulating layer and that overlaps the first semiconductor layer; a third insulating layer disposed on the second conductive layer, a second semiconductor layer disposed on the third insulating layer and that does not overlap the first semiconductor layer; a fourth insulating layer disposed on the second semiconductor layer; a third conductive layer disposed on the fourth insulating layer and that overlaps the second semiconductor layer; and a fifth insulating layer disposed on the third conductive layer. The first semiconductor layer comprises low temperature polycrystalline silicon (LTPS), the second semiconductor layer comprises an oxide semiconductor, and the fourth insulating layer covers an entirety of the second semicon- ductor layer.

According to another embodiment of the present disclo- sure, there is provided a method of forming a semiconductor layer of a display device. The method includes the steps of sequentially stacking an oxide semiconductor, a first insu- lating layer, a conductive layer and a second insulating layer are on a third insulating layer, wherein the oxide semicon- ductor is a metal oxide semiconductor, and the second insulating layer includes multiple layers of silicon oxide (SiOx) and silicon nitride (SiNx); and subjecting a first end and an opposite second end of the oxide semiconductor to a reduction treatment via a heat treatment, without etching the first insulating layer. Hydrogen ions (H+) present in the second insulating layer diffuse into the first end and the second end of the oxide semiconductor, where a conductive source region and a conductive drain region respectively form in at the first end and the second end, and a low- conductive region is formed in a center region of the oxide semiconductor that overlaps the conductive layer. The heat treatment is carried out in a temperature range of 90° C. to 110° C., and a surface resistance of the conductive source region and the conductive drain region is less than 1,000 Ω/□.

According to embodiments of the disclosure, a semicon- ductor layer of an NMOS transistor can be doped with n-type impurity ions by only a heat treatment, and the dehydrogenation of a PMOS transistor can be improved to increase the driving range.

BRIEF DESCRIPTION OF TH E DRAWINGS

DETAILED DESCRIPTION OF EXEMPLARY EMBODIMENTS

Figure 1:
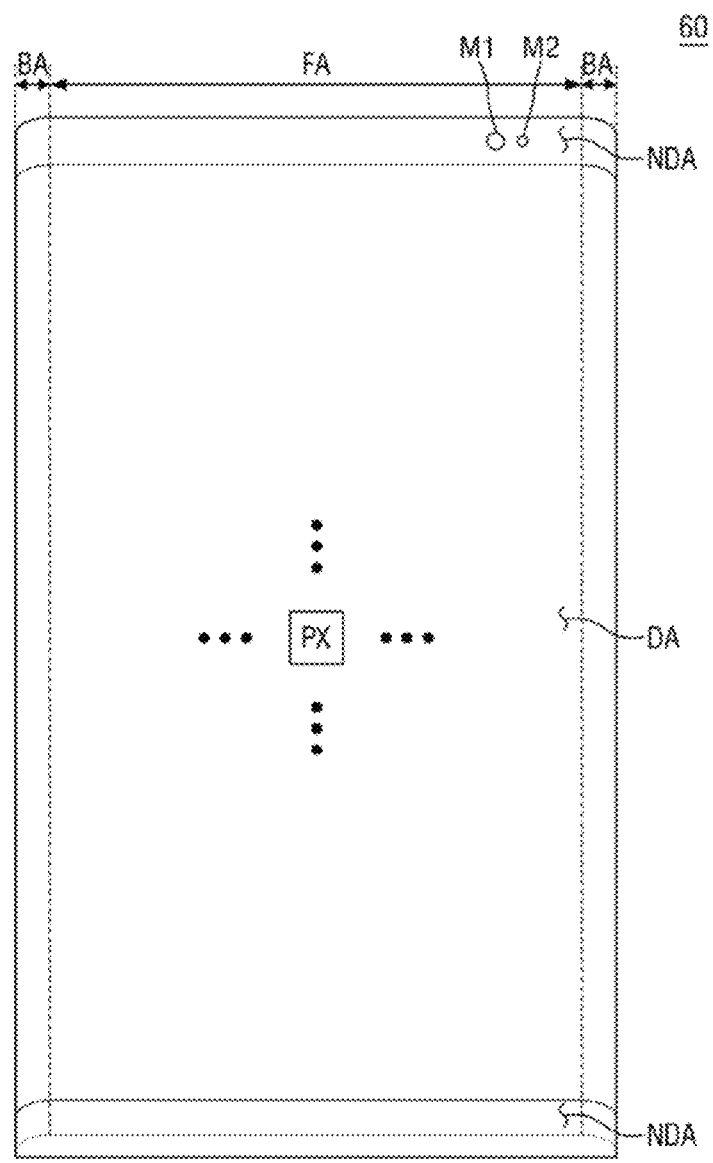
FIG. 1 shows an organic light-emitting display device according to an exemplary embodiment of the present disclosure.

Features of embodiments of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein.

It will be understood that when an element or layer is referred to as being "on", "connected to" or "coupled to" another element or layer, it can be directly on, connected or coupled to the other element or layer or intervening elements or layers may be present.

In the drawings, components may be exaggerated or reduced in size for convenience of explanation. The same reference numerals may be used for the same or similar components throughout the specification.

Display devices according to a variety of exemplary embodiments of the present disclosure may be used as a display screen of a variety of devices that present video or still image or stereoscopic display devices, including portable electronic devices such as a mobile communications terminal, a smart phone, a tablet PC, a smart watch or a navigation device, as well as devices such as a television, a laptop computer, a monitor, an electronic billboard or a device for the Internet of Things.

Hereinafter, embodiments of the present invention will be described in detail with reference to the accompanying drawings. In the following description, an organic light-omitting display device will be described as an example of a display device. It is, however, to be understood that embodiments of the present disclosure are not limited thereto. A display device according to an embodiment can be incorporated into other display devices, such as a liquid-crystal display device, a field emission display (FED) panel or an electrophoretic device, without departing from the spirit of embodiments of the present disclosure. Like reference numerals may denote like elements throughout the drawings.

FIG. 1 shows an organic, light-emitting display device according to an exemplary embodiment of the present disclosure.

Referring to FIG. 1, an organic light-emitting display device 60 according to an exemplary embodiment of the present disclosure includes a display area DA and a non-display area NDA.

According to an embodiment, the display area DA is an area where images are displayed. The display area DA can also be used to detect an external environment. That is to say, the display area DA can be used as an area for displaying an image or recognizing a user's touch or fingerprint. According to an exemplary embodiment of the present disclosure, the display area. DA has a generally flat area FA and at least a partially bent area BA. It is, however, to be understood that embodiments of the present disclosure, are not limited thereto. The display area DA may have a completely flat shape.

According to an embodiment, the organic light-emitting display device 60 includes a plurality of pixels in the display area DA. Each of the pixels includes an organic light-emitting diode. The organic light-emitting display device 60 displays an image using the pixels.

According to an embodiment, the non-display area NDA is an area in which no image is displayed and is disposed on at least one side of the display area DA. In an exemplary embodiment, a speaker module, a camera module M1, a sensor module M2, etc., are disposed in the non-display area NDA. In an exemplary embodiment, the sensor module M2 includes at least one of an illuminance sensor, a proximity sensor, an infrared sensor, or an ultrasonic sensor.

Figure 2:
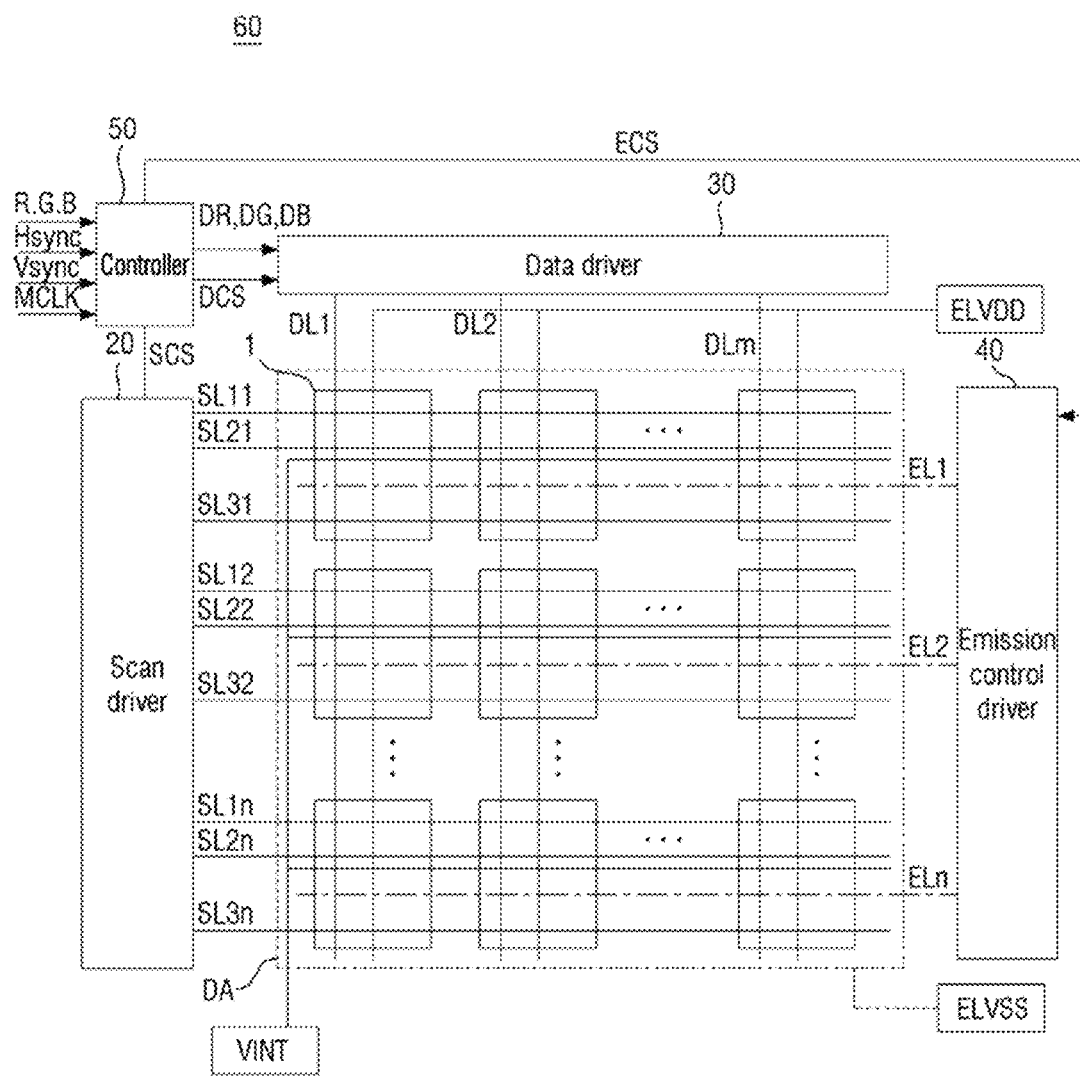
FIG. 2 is a block diagram of an organic light-emitting display device according to an exemplary embodiment of the present disclosure.

FIG. 2 is a block diagram of an organic light-emitting display device according to an exemplary embodiment of the present disclosure.

Referring to FIG. 2, according to an embodiment, the organic light-emitting display device 60 includes a plurality of pixels 1 in the display area DA, a scan driver 20, a data driver 30, an emission control driver 40, and a controller 50.

According, to an embodiment, the display area DA includes the plurality of pixels 1 arranged in a matrix, in which each of the pixels is located at an intersection of a plurality of scan lines SL11 to SL1$n$, SL21 to SL2$n$ and SL31 to SL3$n$, a plurality of data lines DL1 to DLm, and a plurality of emission control lines EL1 to ELn.

According to an embodiment, the plurality of scan lines SL1 to SL1$n$, SL21, to SL2$n$ and SL31 to SL3$n$ and the plurality of emission control lines EL1 to ELn extend in a row direction, and the plurality of data lines DL1 to DLm extend in a column direction. The row direction and the column direction are interchangeable. An initialization voltage (VINT) supply line branches into a plurality of lines that extend in the row direction. A first supply voltage (ELVDD) supply line branches into a plurality of lines that extend, in the column direction. It is, however, to be understood that embodiments of the present disclosure are not limited thereto. The initialization voltage (VINT) supply line and the first supply voltage (ELVDD) supply line may be modified in a variety of ways.

According to an embodiment, in a pixel 1 in the first row and the first column, three scan lines SL11, SL21 and SL31, one data line DL1, one emission control line EL1, one initialization voltage (VINT) supply line, and one first supply voltage (ELVDD) supply line pass. The other pixels have lines similar to the pixel in the first row and the first column.

According to an embodiment, the controller 50 receives a plurality of externally supplied signals that include red, green and blue image signals R.G.B, a horizontal synchronization signal Hsync, a vertical synchronization signal Vsync, and a clock signal MCLK. Based on these signals, the controller 50 generates and transmits an emission control signal ESC to the emission control driver 40, red green and blue data signals DR, DG, DB and a data control signal DCS to the data driver 30, and a scan control signal SCS to the scan driver 20.

According to an embodiment, the scan driver 20 generates and transmits three scan signals to each pixel 1 through the plurality of scan lines SL11 to SL1$n$, SL21 to SL2$n$, and SL31 to SL3$n$, based on the received scan control signal SCS. That is to say, the scan driver 20 sequentially transmits the scan signals to the first scan lines SL11 to SL1$n$, the second scan lines SL21 to SL2$n$, and the third scan lines SL31 to SL3$n$.

According to an embodiment, the data driver 30 transmits a data signal to each pixel 1 through the plurality of data lines DL1 to DLm, based on the received red green and blue data signals DR, DG, DB and the data control signal DCS. The data signal is, transmitted to the pixel 1 selected by a first scan signal whenever the first scan signal is transmitted to the first scan lines SL11 to SL1n.

According to an embodiment, the emission control driver 40 generates and transmits an emission control signal to each pixel through the respective emission control lines EL1 to ELn, based on the emission control signal ECS received from the controller 50. The emission control signal controls the emission time of the pixel 1. The emission control driver 40 may be eliminated depending on the internal structure of the pixel 1, or when the scan driver 20 generates an emission control signal as well as a scan signal.

According to an embodiment, each of the plurality of pixels 1 receives the first supply voltage ELVDD and the second supply voltage ELVSS. The first supply voltage ELVDD has a predetermined high voltage level, and the second supply voltage ELVSS has a voltage level lower than that of the first supply voltage ELVDD.

According to an embodiment, each of the plurality of pixels 1 emits light of a predetermined luminance by receiving a driving current transmitted to a light-emitting element according to a data signal transmitted through the respective data lines DL1 to DLm.

According to an embodiment, the first supply voltage ELVDD, the second supply voltage ELVSS, the initialization voltage VINT, etc., can be received, from external voltage sources.

Figure 3:
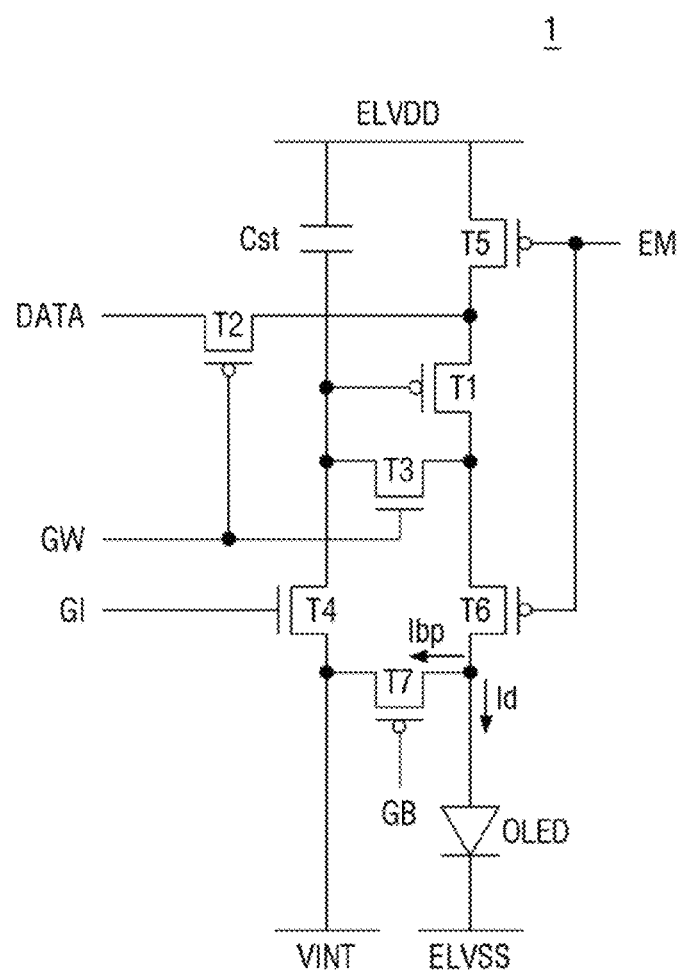
FIG. 3 is an equivalent circuit diagram of a pixel of an organic light-emitting display device according to an exem- plary embodiment of the present disclosure.

FIG. 3 is an equivalent circuit diagram of a pixel of an organic light-emitting display device according to an exemplary embodiment of the present disclosure.

Referring to FIG. 3, according to an embodiment, the circuit of the pixel 1 of the organic light-emitting display device 60 includes an organic light-emitting diode OLED, a plurality of transistors T1 to T7, and a storage capacitor Cst. The circuit of the pixel receives a data signal DATA, a first scan signal GW, a second scan signal GI, a third scan signal GB, an emission control signal EM, a first supply voltage ELVDD, a second supply voltage ELVSS, and an initialization voltage VINT.

According to an embodiment, the organic light-emitting diode OLED includes an anode electrode and a cathode electrode. The storage capacitor Cst includes a first electrode and a second electrode.

According to an embodiment, the plurality of transistors includes first to seventh transistors T1 to T7, Each of the transistors T1 to T7 includes a gate electrode, a first electrode, and a second electrode. One of the first electrode and the second electrode of each of the transistors T1 to T7 is a source electrode and the other is a drain electrode.

According to an embodiment, each of the transistors T1 to T7 is a thin-film transistor. Each of the transistors T1 to T7 may be either a PMOS transistor or an NMOS transistor. In an exemplary embodiment, the first transistor T1 is a driving transistor, the second transistor T2 is a data transfer transistor, the fifth transistor T5 is a first emission control transistor, the sixth transistor T6 is a second emission control transistor, and the seventh transistor T7 is a bypass transistor, and each of the aforementioned transistors is a PMOS transistor. On the other hand, the third transistor T3 is a compensating transistor, and the fourth transistor T4 is an initializing transistor, and the third and fourth transistors T3 and T4 are NMOS transistors. The PMOS transistors and the NMOS transistors have different characteristics. The NMOS transistors used to implement the third and fourth transistors T3 and T4 have a relatively good turn-off characteristic that reduces leakage of the driving current Id during the emission period of the organic light-emitting diode OLED.

Hereinafter, each of the elements will be described in detail.

According to an embodiment, the gate electrode of the first transistor T1 is connected to the first electrode of the storage capacitor Cst. The first electrode of the first transistor T1 is connected to the first supply voltage ELVDD via the fifth transistor T5. The second electrode of the first transistor T1 is connected to the anode electrode of the organic light-emitting diode OLED via the sixth transistor T6. The first transistor T1 receives the data signal DATA by the switching operation of the second transistor T2 to transmit the driving current Id to the organic light-emitting diode OLED.

According to an embodiment, the gate electrode of the second transistor T2 is connected to the first scan signal (GW) terminal. The first electrode of the second transistor T2 is connected to the data signal (DATA) terminal. The second electrode of the second transistor T2 is connected to the first electrode of the first transistor T1 and is connected to the first supply voltage (ELVDD) terminal through the fifth transistor T5. The second transistor T2 is turned on according to the first scan signal GW and performs a switching operation to transfer the data signal DATA to the first electrode of the first transistor T1.

According to an embodiment, the gate electrode of the third transistor T3 is connected to the first Scan signal GW terminal. The first electrode of the third transistor T3 is connected to the second electrode of the first transistor T1 and is connected to the anode electrode of the organic light-emitting diode OLED via the sixth transistor T6. The second electrode of the third transistor T3 is connected to the first electrode of the storage capacitor Cst, the first electrode of the fourth transistor T4 and the gate electrode of the first transistor T1. The third transistor T3 is turned on by the first scan signal GW to connect the gate electrode with the second electrode of the first transistor T1, to diode-connect the first transistor T1. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal DATA that compensates for the threshold voltage to the gate electrode of the first transistor T1.

According to an embodiment, the gate electrode of the fourth transistor T4 is connected to the second scan signal (GI) terminal. The second electrode of the fourth transistor T4 is connected to the initialization voltage (VINT) terminal. The first electrode of the fourth transistor T4 is connected to the first electrode of the storage capacitor Cst, the second electrode of the third transistor T3 and the gate electrode of the first transistor T1. The fourth transistor T4 is turned on by the second scan signal GI to transmit the initialization voltage VINT to the gate electrode of the first transistor T1, to initialize the voltage at the gate electrode of the first transistor T1.

According to an embodiment, the gate electrode of the fifth transistor T5 is connected to the emission control signal EM terminal. The first electrode of the fifth transistor T5 is connected to the first supply voltage ELVDD terminal. The second electrode of the fifth transistor T5 is connected to the first electrode of the first transistor T1 and the second electrode of the second transistor T2.

According to an embodiment, the gate electrode of the sixth transistor T6 is connected to the emission control signal EM terminal. The first electrode of the sixth transistor T6 is connected to the second electrode of the first transistor T1 and the first electrode of the third transistor T3. The second electrode of the sixth transistor T6 is connected to the anode electrode of the organic light-emitting diode OLED.

According to an embodiment, the fifth transistor T5 and the sixth transistor T6 are simultaneously turned on in response to the emission control signal EM so that the driving current Id flows through the organic light-emitting diode OLED.

According to an embodiment, the gate electrode of the seventh transistor T7 is connected to the third scan signal GB terminal. The first electrode of the seventh transistor T7 is connected to the anode electrode of the organic light-emitting diode OLED. The second electrode of the seventh transistor T7 is connected to the initialization voltage VINT terminal. The seventh transistor T7 is turned on by the third scan signal GB to initialize the anode electrode of the organic light-emitting diode OLED. To display a black image, the emission current of the organic light-emitting diode OLED, which is reduced by the amount of a bypass current Ibp exiting from the anode electrode of the organic light-emitting emitting diode OLED through the seventh transistor T7, has the minimum amount of current needed for reliably presenting the black image. Accordingly, it is possible to realize an image with accurate black luminance by using the seventh transistor T7, thereby improving the contrast ratio.

According to an embodiment, although the third scan signal GB is transmitted to the gate electrode of the seventh transistor T7, in other embodiments, the pixel circuit may be configured such that the emission control signal EM is transmitted to the gate electrode of the seventh transistor 17.

In addition, according to an embodiment, although the second scan signal GI and the third scan signal GB are independent from each other, in other embodiments, the circuit can be configured such that the second scan signal GI and the third scan signal GB are the same signal, electrically connected to each other.

According to an embodiment, the second electrode of the storage capacitor Cst is connected to the first supply voltage ELVDD terminal. The first electrode of the storage capacitor Cst is connected to the gate electrode of the first transistor T1, the second electrode of the third transistor T3 and the first electrode of the fourth transistor T4. The cathode electrode of the organic light-emitting diode OLED is connected to the second supply voltage ELVSS terminal. The organic light-emitting diode OLED receives the driving current Id from the first transistor T1 and emits light to display an image.

According to an embodiment, each of the transistors T1 to T7 includes a conductive layer that forms an electrode, a semiconductor layer that forms a channel, and an insulating layer. The first transistor T1, the second transistor T2, the fifth transistor T5, the sixth transistor T6 and the seventh transistor T7, which are MVOS transistors, are thin-film transistors that use a low temperature poly-silicon (LTPS). The third transistor T3 and the fourth transistor T4, which are NMOS transistors, are thin-film transistors that use an oxide semiconductor layer.

In an exemplary embodiment, thin-film transistors that have a top-gate structure in which the gate electrode of each of the transistors T1 to T7 is disposed above the semiconductor layer, will be described as an example. It is, however, to be understood that embodiments of the present disclosure are not limited thereto. At least some of the transistors T1 to T7 can be a thin-film transistor that has a bottom-gate structure in which the gate electrode is disposed below the semiconductor layer.

Hereinafter, the pixel will be described in more detail with reference to its cross-sectional structure.

Figure 4:
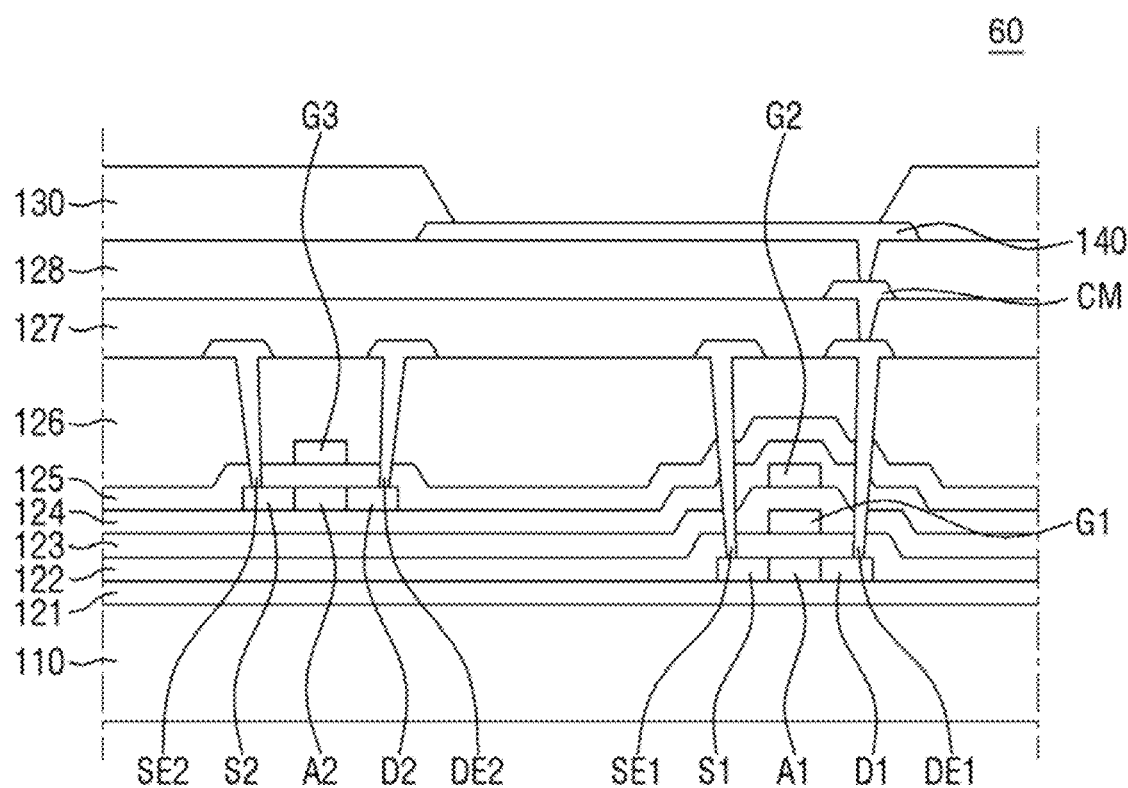
FIG. 4 is a cross-sectional view of an organic light- emitting display device according to an exemplary embodi- ment of the present disclosure.

FIG. 4 is a cross-sectional view of an organic light-emitting display device according to an exemplary embodiment of the present disclosure.

Referring to FIG. 4, according to an embodiment, the layers of the pixel 1 include a substrate 110, a buffer layer 121, lower semiconductor layers S1, A1 and D1, a first insulating layer 122, a first conductive layer G1, a second insulating layer 123, a second conductive layer G2, a third insulating layer 124, upper semiconductor layers S2, A2 and D2, a fourth insulating layer 12S, a third conductive layer B and a fifth insulating layer 126. Each of the layers disclosed above may be made up of a single layer or multiple layers, and another layer may be further disposed between the layers.

According to an embodiment, the substrate 110 supports the layers disposed thereon. A transparent substrate 110 is used when the organic light-emitting display device 60 is a bottom-emission organic light-emitting display device or a double-sided emission organic light-emitting display device. When the organic light-emitting display device 60 is a top-emission organic, light-emitting display device, a semi-transparent or opaque substrate 110 as well as a transparent substrate 110 can be used.

According to an embodiment, the substrate 110 is made of an insulating material such as glass, quartz, or a polymer resin. Examples of a polymer material include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 110 may include a metal.

According to an embodiment, the substrate 110 may be a rigid substrate 110 or a flexible substrate 110 that can be bent, folded, roiled, or so on. Examples of a flexible material for a flexible substrate 110 include, but are not limited to, polyimide (PI).

According to an embodiment, the buffer layer 121 is disposed on the entire surface of the substrate 110. The buffer layer 121 prevents diffusion of impurity ions, permeation of moisture or outside air, and provides a flat surface. The buffer layer 121 includes silicon nitride, silicon oxide, silicon oxynitride, etc. The buffer layer 121 may be eliminated, depending on the type of the substrate 110, the process conditions, etc.

According to an embodiment, the lower semiconductor layers S1, A1 and D1 are active layers that form the channels of the first transistor T1, the second transistor T2, the fifth transistor T5, the sixth transistor T6 and the seventh transistor T7.

According to an embodiment, the lower semiconductor layers S1, A1, and D1 include low temperature poly-silicon (LTPS). It is, however, to be understood that embodiments of the present disclosure are not limited thereto. The lower semiconductor layers S1, A1, and D1 may include monocrystalline silicon, amorphous silicon, etc.

According to an embodiment, thin-film transistors that include a low temperature polycrystalline silicon (LTPS TFTs) typically exhibit excellent carrier mobility even with a small profile, and are thus suitable for implementing integrated driving circuits. Since a low temperature polycrystalline silicon thin film transistor (LTPS TFT) has excellent carrier mobility, it is used for components that have a high operating speed. Despite the feature mentioned above, low temperature polycrystalline silicon thin film transistors (LTPS TFTs) have different initial threshold voltages because of the grain boundary of the polycrystalline silicon semiconductor layer.

According to an embodiment, the lower semiconductor layers S1, A1 and D1 include a source region S1 disposed on one side, a drain region D1 disposed on the other side, a channel region A1 disposed between the source region S1 and the drain region D1. The portions of the lower semiconductor layers S1, A1 and D1 connected to the source electrode SE1 and the drain electrode DE1 of each of the transistors T1, T2, T5, T6 and T7, i.e., the source region S1 and the drain region D1, are doped with impurity ions, specifically p-type impurity ions in the case of PMOS transistors. A trivalent dopant such as boron (B) can be used as a p-type impurity ion.

According to an embodiment, the first insulating layer 122 is disposed on the lower semiconductor layers S1, A1 and D1 and generally on the entire surface of the substrate 110, The first insulating layer 122 is a gate insulating layer that has a gate insulating function.

According to an embodiment, the first insulating layer 122 includes a silicon compound, a metal oxide, etc. For example, the first insulating layer 122 includes silicon oxide (SiOx), silicon nitride (SiNx), oxynitride, aluminum oxide, tantalum oxide, hafnium oxide, zirconium oxide, titanium oxide, etc. They may be used alone or in combinations. The first insulating layer 122 may have a single layer or have multiple layers of different materials stacked on one another.

According to an embodiment, the first conductive layer GI is disposed on the first insulating layer 122. At least a part of the first conductive layer GI overlaps the lower semiconductor layers S1, A1 and D1. As used herein, the phase "an element overlaps with another element" means that one element is over the other element in a thickness direction of the organic light-emitting display device, i.e., the direction perpendicular to surface of the substrate 110 in the drawings, unless specifically stated otherwise.

According to an embodiment, the first conductive layer G1 includes a scan line transmitting a first scan signal (GW in FIG. 3), a scan line for transmitting a third scan signal (GB in FIG. 3), a gate electrode of the first transistor T1, an emission control line for transmitting an emission control signal (EM in FIG. 3), or an initialization voltage line for transmitting an initialization voltage (VINT in FIG. 3).

According to an embodiment, the first conductive layer G1 includes at least one metal selected from molybdenum (Mo), aluminum (Al), platinum (Pt), palladium (Pd), silver (Ag), magnesium (Mg), gold (Au), nickel (Ni) neodymium (Nd), iridium (Ir), chromium (Cr), calcium (Ca), titanium (Ti), tantalum (Ta), tungsten (W) or copper (Cu). The first conductive layer G1 may have a single layer or multiple layers.

According to an embodiment, the second insulating layer 123 covers the first conductive layer G1. The second insulating layer 123 is generally disposed on the entire surface of the substrate 110. The second insulating layer 123 is a gate insulating layer that has a gate insulating function. The second insulating layer 123 may include the same material as the first insulating layer 122 or may include one or more other materials selected from those listed above for the first insulating layer 122. The second insulating layer 123 may have a single layer or multiple layers of different materials stacked on one another.

According to an embodiment, the second conductive layer G2 is disposed on the second insulating layer 123. The second conductive layer G2 overlaps at least part of the lower semiconductor layers and the first conductive layer G1. The second conductive layer G2 may include the same material as the first conductive layer G1 or may include at least one other material selected from those listed for the first conductive layer G1. The second conductive layer G2 may have a single layer or multiple layers of different materials stacked on one another.

According to an embodiment, the second conductive layer G2 includes a storage capacitor (Cst in FIG. 3) electrode line and another emission control line for transmitting the emission control signal EM.

According to an embodiment, the third insulating layer 124 insulates the second conductive layer G2 from the upper semiconductor layers S2, A2 and D2, which will be described below. The third insulating layer 124 is disposed on the first conductive layer GI and is generally formed on the entire surface of the substrate 110. The third insulating layer 124 is an interlayer dielectric layer.

According to an embodiment, the third insulating layer 124 includes an inorganic insulating material such as silicon oxide (SiOx), silicon nitride (SiNx), silicon oxynitride, hafnium oxide, aluminum oxide, titanium oxide, tantalum oxide or zinc oxide, or an organic insulating material such as polyarrylates resin, epoxy resin, phenolic resin, polyamides resin, polyimides resin, unsaturated polyesters resin, poly phenylenethers resin, polyphenylenesulfides resin or benzocyclobutene (BCB). The third insulating layer 124 may have a single layer or multiple layers of different materials stacked on one another.

According to an embodiment, the upper semiconductor layers S2, A2 and D2 are disposed on the third insulating layer 124. Specifically, the upper semiconductor layers S2, A2 and D2 are be disposed on the third insulating layer 124 but do not overlap the lower semiconductor layers S1, A1 and D1. The upper semiconductor layers S2, A2 and D2 may include one of amorphous silicon tat-Si), polycrystalline silicon (p Si), an oxide semiconductor or an organic semiconductor. The oxide semiconductor includes at least one of Zn, In, Ga, Sn, or a mixture thereof. The oxide semiconductor is a metal oxide semiconductor and is made of a metal oxide such as those formed from zinc (Zn), indium (In), gallium (Ga), tin (Sn) or titanium (Ti), or a metal such as zinc (ZN), indium (In), gallium (Ga), tin (Sn) or titanium (Ti), or oxides thereof. For example, the oxide semiconductor material can be one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

According to an embodiment, the upper semiconductor layers S2, A2 and D2 include a source region S2 disposed on one side, a drain region D2 disposed on the opposite side, a channel region A2 disposed between the source region S2 and the drain region D2. The portions of the upper semiconductor layers S2, A2 and D2 connected to the source electrode SE2 and the drain electrode DE2 of each of the transistors T3 and T4, i.e., the source region S2 and the drain region D2, are doped with impurity ions, specifically n-type impurity ions in the case of NMOS transistors. The n-type impurity ions may be an alkali metal, an alkaline earth metal or an n-type organic dopant. Examples of n-type organic dopant include Cr2hpp4(hpp: anion of 1,3,4,6,7,8-hexahydro-2H-mimido[1,2-a]pyrimidine), Fe2hpp4, Mn2hpp4, Co2hpp4, Mo2hpp4, W2hpp4, Ni2hpp4, Cu2hpp4, Zn2hpp4, W(hpp)4, etc. In addition, the examples include organic dopant cow pounds as other such 4,4',5,5'-tetracyclohexyl-1,1',2,2',3,3"-hexamethyl-2,2',3,3-tetrahydro-1H,1'H2,2'-biimidazole; 2,2'-diisopropyl-1,1',3,3'-tetramethyl-2,2',3,3',4,4'5,5',6,6',7,7'-dodecahydro-1H,1'H-2,2'-bibenzo[d]imidazole; 2,2'-diisopropyl-4,4',5,5'-tetrakis(4-metboxyphenyl)-1,1', 3,3'-tetramethyl-2,2',3,3'-tetrahydro-1H,1'H,2,2'-biimidazole; 2,2'-diisopropyl-4,5-bis(2-methoxyphenyl)-4',5'-bis(4-methoxyphenyl)-1,1',3,3'-tetramethyl-2,2', 3,3'-tetrahydro-1H,1'H-2,2'-biimidazole); or 2,2'-diisopropyl-4,5-bis(2-methoxyphenyl)-4',5'-bis(3-methoxyphenyl)-1,1',3,3'-tetramethyl-2,2', 3,3'-tetrahydro-1H,1'H-2,2'-bimidazole.

According to an embodiment, when the upper semiconductor layers S2, A2 and D2 include an oxide semiconductor, light-blocking layers that block light from the upper semiconductor layers S2, A2 and D2 are formed on and under the upper semiconductor layers S2, A2 and D2.

According to an embodiment, the fourth insulating layer 125 is disposed on the upper semiconductor layers S2, A2 and D2. The fourth insulating layer 125 covers the entire upper semiconductor layers S2, A2, and D2. For example, the fourth insulating layer 125 is disposed on the upper semiconductor layers S2, A2 and D2 and is formed on the entire surface of the substrate 110.

According to an embodiment, the fourth insulating layer 125 is a gate insulating layer that has a gate insulating function. The fourth insulating layer 125 may include the same material as the first insulating layer 122, or may include one or more other materials selected from those listed above for the first insulating layer 122. The second insulating layer 123 may a single layer or multiple layers of different materials stacked on one another.

According to an embodiment, the third conductive layer G3 is disposed on the fourth insulating layer 125. The third conductive layer G3 overlaps at least a part of the upper semiconductor layers S2, A2, and D2. The third conductive layer G3 may include the same material as the first conductive layer G1 or may include at least one other material selected from those listed above for the first conductive layer G1. The third conductive layer G3 may have a single layer or multiple layers of different materials stacked on one another.

According to an embodiment, the third conductive layer G3 includes a scan line for transmitting a first scan signal (GW in FIG. 3), the gate electrode of die third transistor T3, and the gate electrode of the fourth transistor T7.

According to an embodiment, the fifth insulating layer 126 covers the fourth conductive layer. The fifth insulating layer 126 is disposed on the first conductive layer G1 and generally on the entire surface of the substrate 110. The fifth insulating layer 126 is an interlayer dielectric layer. The fifth insulating layer 126 includes multiple layers of silicon oxide (SiOx) and silicon nitride (SiNx). It is, however, to be understood that embodiments of the present disclosure are not limited thereto. The fifth insulating layer 126 may have a single layer that includes a silicon oxide (SiOx), a silicon nitride (SiNx), a silicon oxynitride, an aluminum oxide, a tantalum oxide, a hafnium oxide, a zirconium oxide, titanium oxide, etc. or multiple layers of different materials stacked on one another.

According to an embodiment, the fifth insulating layer 126 is used to supply hydrogen ions (H+) so that n-type impurity ions can be doped into the upper semiconductor layers S2, A2 and D2 via a heat treatment. This will be described in detail below with reference to FIGS. 5 to 7. In addition, the fifth insulating layer 126 provides a flat surface.

According to an embodiment, a plurality of source electrodes SE1 and SE2 and a plurality of drain electrodes DE1 and DE2 are disposed on the fifth insulating layer 126. Each of the source electrodes SE1 and SE2 and the drain electrodes DE1 and DE2 is formed of a conductive metal. For example, the source electrodes SE1 and SE2 and the drain electrodes DE1 and DE2 may include aluminum (Al), copper (Cu), titanium (Ti), or molybdenum (Mo).

According to an embodiment, the first source electrode SEE is electrically connected to the source region S1 of the lower semiconductor layers S1, A1 and D1, and the first drain electrode DE1 is electrically connected to the drain region D1 of the lower semiconductor layers S1, A1 and D1. More specifically, the first source electrode SE1 and the first drain electrode DE1 are respectively electrically connected to the source region S1 and the drain region D1 of the lower semiconductor layers S1, A1 and D1 through contact holes that penetrate the first to fifth insulating layers 122 to 126, respectively.

According to an embodiment, the second source electrode SE2 is electrically connected to the source region S2 of the upper semiconductor layers S2, A2 and D2, and the second drain electrode DE2 is electrically connected to the drain region D2 of the upper semiconductor layers S2, A2 and D2. More specifically, the second source electrode SE2 and the second drain electrode DE2 are respectively electrically connected to the source region S2 and the drain region D2 of the upper semiconductor layers S2, A2 and D2 through contact holes that penetrate the fourth insulating layer 125 and the fifth insulating layer 126.

According to an embodiment, a first via layer 127 is disposed on the fifth insulating layer 126 and is formed on the entire surface of the substrate 110 to cover the plurality of source electrodes SE1 and SE2 and the plurality of drain electrodes DE1 and DE2. The first via layer 127 is made of an insulating material. For example, the first via layer 127 may include a single layer or multiple layers of an inorganic material, an organic material, or an organiclinorganic composite, and may be formed by various deposition methods. In some exemplary embodiments, the first via layer 127 is made of one or more of polyacrylates resin, epoxy resin, phenolic resin, polyamides resin, polyimides resin, unsaturated polyesters resin, polyphenylemethers resin, polyphenylenesulfides resin, or benzocyclobutene (BCB).

According to an embodiment, a second via layer 128 is disposed on the first via layer 127. The second via layer 128 is formed on the entire surface of the substrate 110. The second via layer 128 may include the same material as the first via layer 127 or may include one or more other materials listed above for the first via layer 127.

According to an embodiment, a contact metal CM is disposed between the first via layer 127 and the second via layer 128. A pixel electrode 140 is electrically connected to the contact metal CM through a contact hole in the second via layer 128. The contact metal CM is electrically connected to the first drain electrode DE1 through a contact hole in the first via layer 127. The contact metal CM electrically connects the pixel electrode 140 with the first drain electrode DE1. It is to be noted that the first via layer 127 and the contact metal CM may be eliminated. Then, the pixel electrode 140 can be directly connected to the first drain electrode DE1 through the contact hole in the second via layer 128.

According to an embodiment, the pixel electrode 140 is disposed on the second via layer 128. The pixel electrode 140 is an anode electrode of the organic light-emitting diode.

According to an embodiment, the pixel electrode 140 includes a material having a high work function. The pixel electrode 140 includes one of indium-tin-oxide (ITO), indium-zinc-oxide (IZO), zinc oxide (ZnO), indium oxide ($In_2O_3$), etc. The above-listed conductive materials have a relatively high work function and are transparent. When an organic light-emitting display device is a top-emission organic light-emitting display device, the pixel electrode 140 may further include a reflective material such as silver (Ag), magnesium (Mg), aluminum (Al), platinum (Pt), palladium (Pb), gold (Au), nickel (Ni), neodymium (Nd), (Ir), chrome (Cr), lithium (Li), calcium (Ca) or a combination thereof in addition to the above-listed conductive materials. Accordingly, the pixel electrode 140 may have a single-layer structure of the above-listed conductive materials and the reflective materials, or may have a multi-layer structure in which the single layers are stacked on one another.

According to an embodiment, a pixel defining layer 130 is disposed on the pixel electrode 140. The pixel defining layer 130 includes an opening via which exposes at least a part of the pixel electrode 140. The pixel defining layer 130 may include an organic material or an inorganic material. In an exemplary embodiment, the pixel defining layer 130 includes a material such as a photoresist, a polyimide resin, an acrylic resin, a silicon compound or a polyacrylic resin.

According to an embodiment, an organic emissive layer is disposed on the portion of the pixel electrode 140 exposed by the pixel defining layer 130, and a common electrode is disposed on the organic emissive layer. The common electrode is a cathode electrode of the organic light-emitting diode.

According to an embodiment, the common electrode includes a material having a low work function. The common electrode includes one of Li, Ca, LiF/Ca, LiF/Al, Al, Me, Ag, Pt, Pd, Ni. Au, Nd, Ir, Cr, BaF, Ba, or a compound or mixture thereof e.g., a mixture of Ag and Mg. The common electrode further includes an auxiliary electrode. The auxiliary electrode includes a layer formed by depositing the low work function material, and a transparent metal oxide on the layer, such as indium-tin-oxide (ITO), indium-zinc-oxide (IZO), zinc oxide (ZnO) or indium-tin-zinc-oxide (ITZO).

According to an embodiment, when the organic light-emitting diode display device 60 is a top-emission organic light-emitting diode display device, a thin conductive layer having a low work function is formed as the common electrode, and a transparent conductive layer such as an indium-tin-oxide (ITO) layer, an indium-zinc-oxide (IZO) layer, a zinc oxide (ZnO) layer or an indium oxide ($In_2O$) layer is formed thereon.

According to an embodiment, the pixel electrode 140, the organic emissive layer and the common electrode form an organic light-emitting diode.

Hereinafter, a method of fabricating the source region A2 and the drain region D2 of the upper semiconductor layers S2, A2 and D2 will be described.

Figure 5:
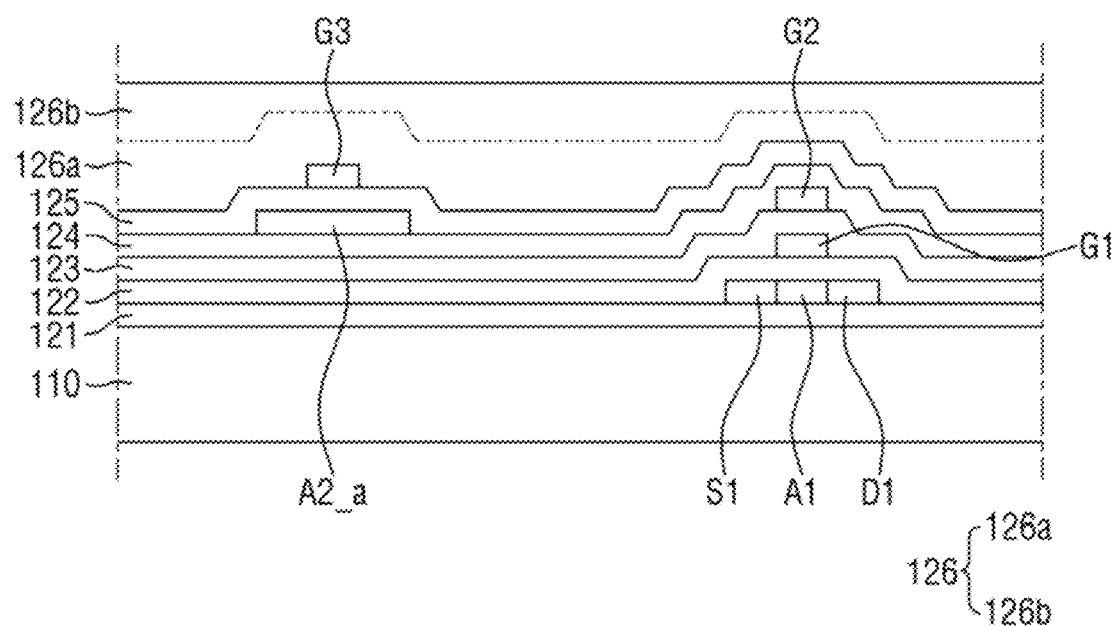
FIGS. 5 to 7 are cross-sectional views that illustrate a process of forming the source region and the drain region of the upper semiconductor layers, according to an exemplary embodiment of the present disclosure.
Figure 6:
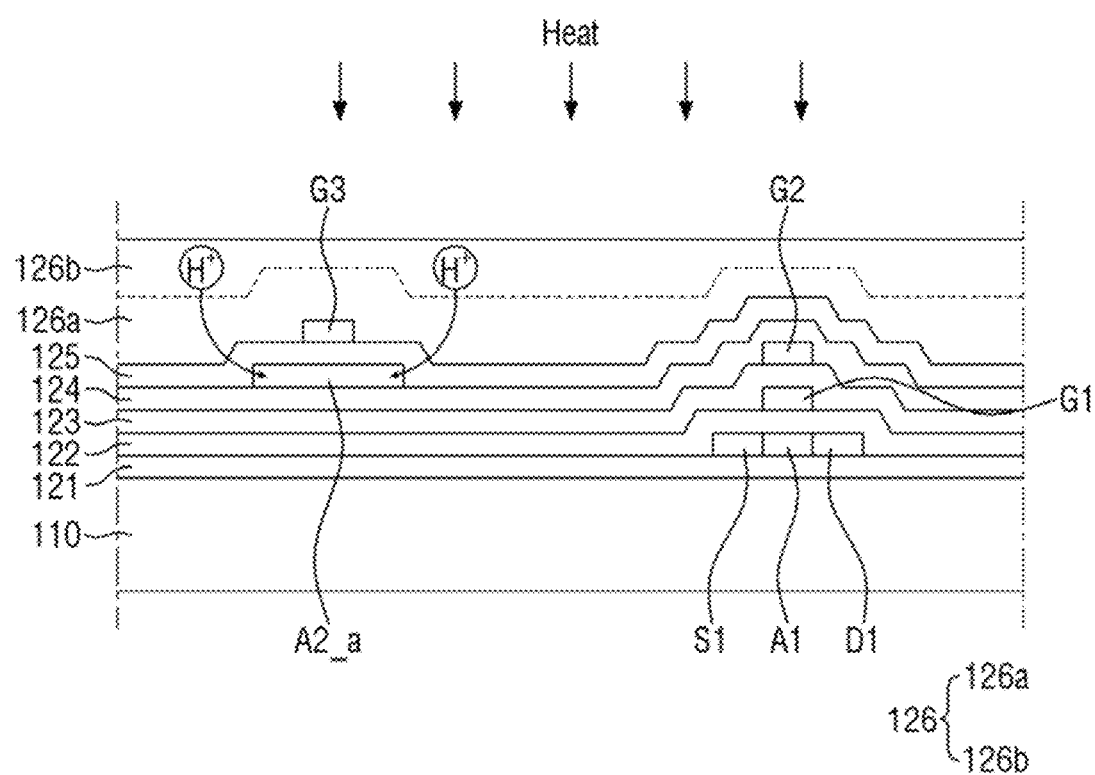
Figure 7:
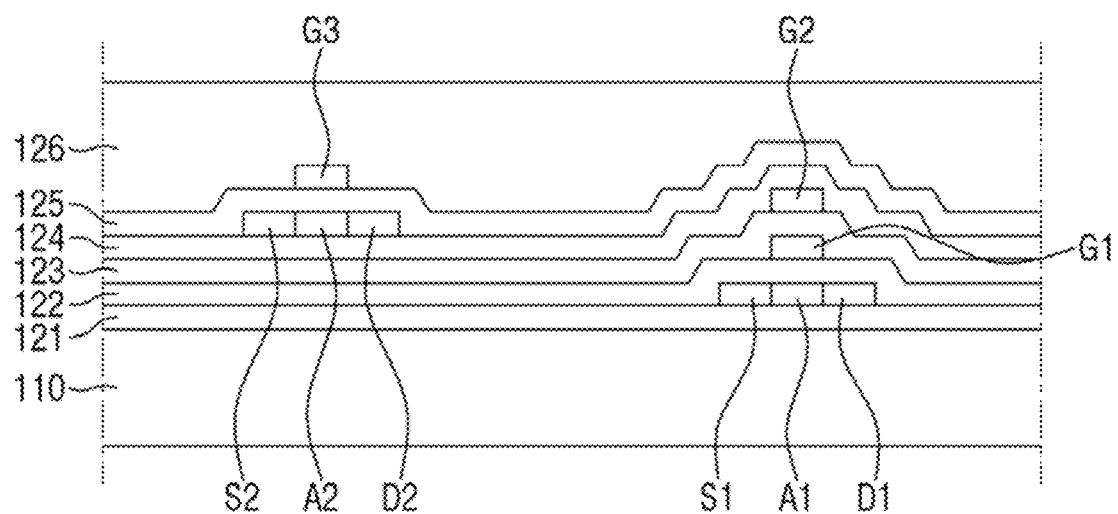

FIGS. 5 to 7 are cross-sectional views that illustrate a process of forming the source region and the drain region of the upper semiconductor layers.

Referring now to FIGS. 5-7, according to an embodiment, an oxide semiconductor A2_a a forth insulating layer 125, a third conductive layer G3 and a fifth insulating layer 126 are sequentially stacked on the third insulating layer 124. The oxide semiconductor A2_a is a metal oxide semiconductor such as indium-gallium-zinc oxide (IGZO) as described above. The fifth insulating layer 126 includes multiple layers made of silicon oxide (SiOx) and silicon nitride (SiNx) as described above. For example, the fifth insulating layer 126 has multiple layers in which a silicon oxide layer 126b is stacked on a silicon nitride layer 126a. The stack structure of the fifth insulating layer 126 is not limited thereto. In another exemplary embodiment, the fifth insulating layer 126 includes multiple layers formed by stacking a silicon nitride layer on a silicon oxide layer, or may be a single layer that includes silicon oxide or silicon nitride.

Subsequently, according to an embodiment, a first end and an opposite second, end of the oxide semiconductor A2_a is subjected to a reduction treatment via a heat treatment, without a separate etching process, e.g., a process of etching the fourth insulating layer 125. When heat is applied from above the substrate, hydrogen ions (H+) present in the fifth insulating layer 126 diffuse into the oxide semiconductor A2_a. In an exemplary embodiment, the hydrogen ions (H+) are mainly generated in the silicon nitride layer 126b of the fifth insulating layer 126 and diffuse into the oxide semiconductor A2_a during the heat treatment, as shown in FIG. 6.

According to an embodiment, by performing the heat treatment, the hydrogen ions (H+) diffuse into the first end and the second end of the oxide semiconductor A2_a such that reduction begins, to form a conductive source region S2 and a conductive drain region D2. Since the oxide semiconductor includes a region that overlaps the third conductive layer G3, the reduction becomes weaker toward the center of the oxide semiconductor A2_a, to form a low-conductive region. The source region S2 and the drain region D2 are formed at the first end and the second end of the oxide semiconductor A2_a, respectively, after the reduction by heat treatment, and a channel region A2, which is the low-conductive region, is formed between the source region S2 and the drain region D2, as shown in FIG. 7.

According to an embodiment, the heat treatment is carried out at about 90° C. to about 110° C. However, the temperature is not limited thereto, and the heat treatment can carried out at a higher temperature than 110° C. it is to be understood that the hydrogen ions (H+) are not necessarily generated in the fifth insulating layer 126. Hydrogen ions (H+) present in the third insulating layer 124 and the fourth insulating layer 125 may diffuse into the oxide semiconductor A2_a.

According to an embodiment, the fourth insulating layer 125 has a minimum thickness so that hydrogen ions (H+) generated in the fifth insulating layer 126 essentially do no reach the lower semiconductor layers S1, A1 and D1. In an exemplary embodiment, if the heat treatment temperature is approximately 95° C., the thickness of the fourth insulating layer 125 is equal to or greater than 1,300 Å. The hydrogen concentration in the fourth insulating layer 125 is less than or equal to about $9 \times 10^{20}$ atoms/$cm^3$.

According to an embodiment, the third insulating, layer 124 has a thickness of greater than or equal to about 3,000 Å. The hydrogen concentration in the third insulating layer 124 less than or equal to about $9 \times 10^{20}$ atoms/$cm^3$. The thickness of the fifth insulating layer 126 is about 5,000 Å. In an exemplary embodiment, the fifth insulating layer 126 includes a silicon oxide (SiOx) layer having a thickness of greater than or equal to about 3,000 Å, and a silicon nitride (SiNx) layer having a thickness of about 1,500 Å to about 2,500 Å that is disposed on the silicon oxide (SiOx) layer.

According to an embodiment, the surface resistance of the upper semiconductor layers S2, A2 and D2 doped with the n-type impurity ions by the heat treatment is less than 1,000Ω/□. Specifically, the surface resistance of the source region S2 and the drain region D2 is less than or equal to about 1,000 Ω/□.

In this manner, according to an embodiment, by doping the oxide semiconductor, with the n-type impurity ions only by a heat treatment and without an additional etching: process, it is possible to prevent side effects that possibly occur during the etching process, such as an increase in the taper angle, a short-circuit in the third conductive layer G3 and the upper semiconductor, etc. In addition, according to an above-described doping scheme according to an embodiment, it is possible to decrease the wiring resistance of the upper semiconductor layers S2, A2 and D2 by increasing the temperature during the heat treatment. Since the heat treatment temperature can be increased, the dehydrogenation in the lower semiconductor layers S1, A1 and D1 can be improved, so that the driving range of the transistors T1, T2, T5, T6 and T7 that include the lower semiconductor layers S1, A1 and D1 can be increased. Even if the heat treatment temperature is increased, it is possible to prevent the hydrogen ions (H+) from diffusing into the transistors T1, T2, T5, T6 and T7 by adjusting the thickness of the fourth insulating layer 125. In an exemplary embodiment, the driving range of the transistors T1, T2, T5, T6 and T7 is greater than or equal to about 2.9 V.

Next, an organic light-emitting display device according to an exemplary embodiment of the present disclosure will be described. The elements already described above with respect to FIGS. 1 to 7 will not be described again. In addition, like reference numerals may denote features analogous to those described above with reference to FIGS. 1 to 7.

Figure 8:
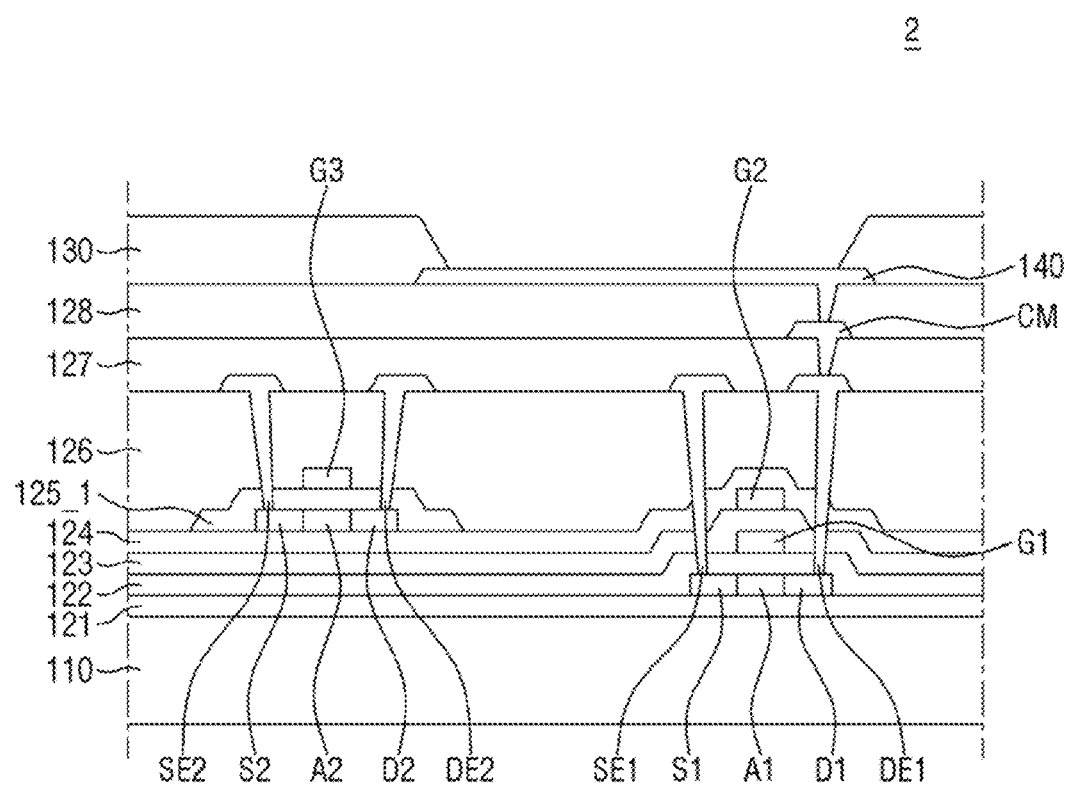
FIG. 8 is a cross-sectional view of an organic, light-emitting display device according to an exemplary embodiment of the present disclosure.

FIG. 8 is a cross-sectional view of an organic light-emitting display device 61 according to an exemplary embodiment of the present disclosure.

According to an embodiment, the organic light-emitting display device 61 shown in FIG. 8 differs from the organic light-emitting display device 60 shown in FIGS. 1 to 7 in that a fourth insulating layer 125_1 is formed only in a part of the substrate 110 to cover the upper semiconductor layers S2, A2 and D2, not on the entire surface of the substrate 110.

According to an embodiment, the fourth insulating layer 125_1 includes the same material as the first insulating layer 122 shown in FIG. 4, or may include one or more other materials selected from those listed above for the first insulating layer 122.

According to an embodiment, the fourth insulating layer 125_1 covers the upper and side portions of the upper semiconductor layers S2, A2 and D2. Since the fourth insulating layer 125_1 covers the upper semiconductor layers S2, A2 and D2 it performs the same function of supplying hydrogen ions (H+) so that the upper semiconductor layers S2, A2 and D2 can be doped with n-type impurity ions via a heat treatment, as in the exemplary embodiments shown in FIGS. 1 to 7.

Figure 9:
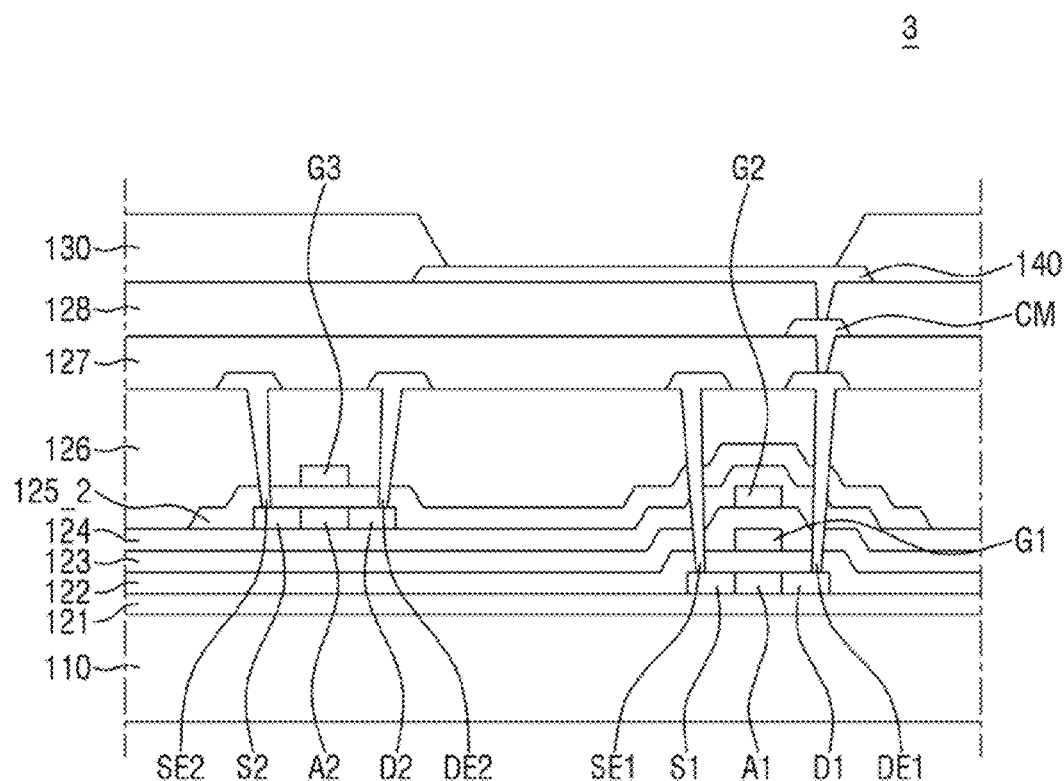
FIG. 9 is a cross-sectional view of an organic light-emitting display device according to an exemplary embodiment of the present disclosure.

FIG. 9 is a cross-sectional view of an organic light-emitting display device according to an exemplary embodiment of the present disclosure.

According to an embodiment, an organic light-emitting display device 62 shown in FIG. 9 differs from the organic light-emitting display device 60 shown in FIGS. 1 to 7 in that a fourth insulating layer 125_2 is obtained in a part of the substrate 110 to cover the upper semiconductor layers S2, A2 and D2, not on the entire surface of the substrate 110. Further, the organic light-emitting display device 62 shown in FIG. 9 differs from the organic light-emitting display device 61 shown in FIG. 8 in that the fourth insulating layer 125_2 includes a portion that overlaps and covers the lower semiconductor layers S1, A1 and D1.

According to an embodiment, the fourth insulating layer 125_2 may include the same material as the first insulating layer 122 shown in FIG. 4, or may include one or more other materials selected from those listed above for the first insulating layer 122.

According to an embodiment, the fourth insulating layer 125_2 covers the upper and side portions of the upper semiconductor layers S2, A2 and D2. Further, the fourth insulating layer 125_2 extends to a region that overlaps the lower semiconductor layers S1, A1 and D1.

According to an embodiment, since the fourth insulating layer 125_2 covers the upper semiconductor layers S2, A2 and D2, it performs the same function of supplying hydrogen ions (H+) so that the upper semiconductor layers S2, A2 and D2 can be doped with n-type impurity ions via a heat treatment, as in the exemplary embodiments Shown in FIGS. 1 to 7, hi addition, since the fourth insulating layer 125_2 extends to the region that overlaps the lower semiconductor layers, it is possible to prevent the hydrogen ions (H+) from diffusing into the lower semiconductor layers S1, A1 and D1, to thereby increase the driving range of the transistors T1, T2, T5, T6 and T7 that include the lower semiconductor layers S1, A1 and D1.

Effects of embodiments of the present disclosure are not limited by the foregoing, and other various effects are anticipated herein.

Although exemplary embodiments of the present disclosure have been disclosed for illustrative purposes, those skilled in the art will appreciate that various modifications, additions and substitutions are possible, without departing from the scope and spirit of embodiments of the disclosure as recited in the accompanying claims.

What is claimed is:
1. A light-emitting display device, comprising:
a substrate with a display area and a non-display area;
a buffer layer disposed on the substrate;
a first semiconductor layer disposed on the buffer layer in the display area;
a first insulating layer disposed on the first semiconductor layer;
a first conductive layer disposed on the first insulating layer and that overlaps the first semiconductor layer;
a second insulating layer disposed on the first conductive layer;
a second semiconductor layer disposed on the second insulating layer in the display area and that does not overlap the first semiconductor layer;
a third insulating layer disposed on the second semiconductor layer;
a second conductive layer disposed on the third insulating layer and that overlaps the second semiconductor layer;
a fourth insulating layer disposed on the second conductive layer, and
a third conductive layer disposed on the fourth insulating layer in the display area,
wherein the first semiconductor layer comprises low temperature polycrystalline silicon (LTPS),
wherein the second semiconductor layer comprises an oxide semiconductor,
wherein the third insulating layer overlaps an upper surface of the second semiconductor layer, and
wherein the third insulating layer has a hydrogen concentration that is less than or equal to $9 \times 10^{20}$ atoms/cm$^3$,
wherein the third conductive layer comprises:

a first electrode directly connected to the first semiconductor layer, a second electrode directly connected to the first semiconductor layer and spaced apart from the first electrode, a third electrode directly connected to the second semiconductor layer, and a fourth electrode directly connected to the second semiconductor layer and spaced apart from the third electrode.

2. The light emitting display device of claim 1, wherein the oxide semiconductor is indium-gallium-zinc oxide (IGZO).

3. The light-emitting display device of claim 1,
wherein the third insulating layer has a thickness that is greater than or equal to 1,300 Å, and
wherein a surface resistance of the second semiconductor layer is equal to or less than 1,000Ω/☐.

4. The light-emitting display device of claim 1, wherein a thickness of the second insulating layer is greater than or equal to 3,000 Å.

5. The light-emitting display device of claim 4, wherein the second insulating layer comprises silicon oxide (SiOx).

6. The light-emitting display device of claim 5, wherein the second insulating layer contains a hydrogen concentration that is less than or equal to $9 \times 10^{20}$ atoms/cm$^3$.

7. The light-emitting display device of claim 1, wherein a thickness of the fourth insulating layer is greater than or equal to 5,000 Å.

8. The light-emitting display device of claim 1, wherein the fourth insulating layer includes multiple layers of a silicon oxide (SiOx) layer and a silicon nitride (SiNx) layer.

9. The light-emitting display device of claim 8, wherein a thickness of the silicon oxide layer is greater than or equal to 3,000 Å, and a thickness of the silicon nitride layer ranges from 1,500 Å to 2,500 Å.

10. The light-emitting display device of claim 1, wherein the second semiconductor layer comprises
a source region and a drain region at a first end and an opposite second end thereof, respectively, and comprises
a channel region between the source region and the drain region, and
wherein the source region and the drain region are doped with n-type impurity ions.

11. The light-emitting display device of claim 1, wherein the first insulating layer overlaps the second semiconductor layer.

12. The light-emitting display device of claim 1, wherein each of the first electrode, the second electrode, the third electrode and the fourth electrode is disposed in the display area.

* * * * *